US009722162B2

United States Patent
Kaga et al.

(10) Patent No.: US 9,722,162 B2
(45) Date of Patent: Aug. 1, 2017

(54) SEMICONDUCTOR LIGHT EMITTING DEVICE

(71) Applicant: Kabushiki Kaisha Toshiba, Minato-ku, Tokyo (JP)

(72) Inventors: Koji Kaga, Komatsu Ishikawa (JP); Jumpei Tajima, Mitaka Tokyo (JP); Toshiyuki Oka, Kanazawa Ishikawa (JP); Kazuyuki Miyabe, Kanazawa Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/056,339

(22) Filed: Feb. 29, 2016

(65) Prior Publication Data
US 2017/0077366 A1    Mar. 16, 2017

(30) Foreign Application Priority Data

Sep. 10, 2015    (JP) .................................. 2015-178165

(51) Int. Cl.
*H01L 33/62*    (2010.01)
*H01L 27/14*    (2006.01)
(Continued)

(52) U.S. Cl.
CPC ............ *H01L 33/62* (2013.01); *H01L 27/153* (2013.01); *H01L 33/36* (2013.01)

(58) Field of Classification Search
CPC ....... H01L 33/62; H01L 33/36; H01L 27/153; H01L 27/15; H01L 27/156
See application file for complete search history.

(56) References Cited

U.S. PATENT DOCUMENTS

| 7,880,185 B2 | 2/2011 | Nagai | |
|---|---|---|---|
| 2006/0017060 A1* | 1/2006 | Chen | H01L 33/385 257/99 |

(Continued)

FOREIGN PATENT DOCUMENTS

| JP | H08-102552 A | 4/1996 |
|---|---|---|
| JP | 2014-170977 A | 9/2014 |

(Continued)

OTHER PUBLICATIONS

Taiwanese Office Action issued on Oct. 21, 2016 in counterpart Taiwanese patent Application No. 105107408, along with English translation thereof.

*Primary Examiner* — Galina Yushina
(74) *Attorney, Agent, or Firm* — White & Case LLP

(57) ABSTRACT

A semiconductor light emitting device includes first and second light emitting bodies, a first electrode, a second electrode and a first interconnection. The first and second light emitting bodies are disposed on a conductive substrate, and each includes first and second semiconductor layers and a light emitting layer therebetween. The first electrode is provided between the first light emitting body and the conductive substrate, and electrically connected to a first semiconductor layer and the conductive substrate. The second electrode is provided between the second light emitting body and the conductive substrate, and electrically connected to a first semiconductor layer. The first interconnection electrically connects the second semiconductor layer of the first light emitting body and the second electrode. The first interconnection includes a first portion extending over the first and second light emitting bodies and a second portion extending into the second light emitting body.

9 Claims, 11 Drawing Sheets

(51) Int. Cl.
*H01L 27/15* (2006.01)
*H01L 33/36* (2010.01)

(56) References Cited

U.S. PATENT DOCUMENTS

| | | | |
|---|---|---|---|
| 2011/0018013 A1 | 1/2011 | Margalith et al. | |
| 2012/0043563 A1 | 2/2012 | Ibbetson et al. | |
| 2012/0292631 A1 | 11/2012 | Katsuno et al. | |
| 2013/0299774 A1* | 11/2013 | Lu | H01L 27/15 257/13 |
| 2014/0131729 A1* | 5/2014 | Heo | H01L 33/62 257/76 |
| 2014/0191269 A1 | 7/2014 | Katsuno et al. | |
| 2014/0231833 A1 | 8/2014 | Jeong | |
| 2015/0069447 A1* | 3/2015 | Chen | H01L 33/20 257/98 |
| 2015/0263230 A1 | 9/2015 | Katsuno et al. | |

FOREIGN PATENT DOCUMENTS

| | | |
|---|---|---|
| TW | 2011-15729 A1 | 5/2011 |
| TW | 2013-10703 A1 | 3/2013 |

* cited by examiner

SEMICONDUCTOR LIGHT EMITTING DEVICE

CROSS-REFERENCE TO RELATED APPLICATIONS

This application is based upon and claims the benefit of priority from Japanese Patent Application No. 2015-178165, filed on Sep. 10, 2015; the entire contents of which are incorporated herein by reference.

FIELD

Embodiments are related generally to a semiconductor light emitting device.

BACKGROUND

A semiconductor light emitting device comprises a light emitting diode (LED) as a light source. Such a semiconductor light emitting device may include a plurality of LEDs provided on a substrate, and exhibit high luminance characteristics. Further, it becomes possible to reduce a driving current of the semiconductor light emitting device by connecting the plurality of LEDs in series, and to improve the reliability thereof as compared with a case where the plurality of LEDs is connected in parallel and driven by the same electric power. Each of the plurality of LEDs, however, has to be electrically isolated from the substrate in order to be connected in series, and thus, the bonding pads, which connect the plurality of LEDs to an external circuit, are disposed on the substrate. This may inhibit the heat dissipation through the substrate, and also make it difficult to downsize the semiconductor light emitting device.

DETAILED DESCRIPTION

Figure 1:
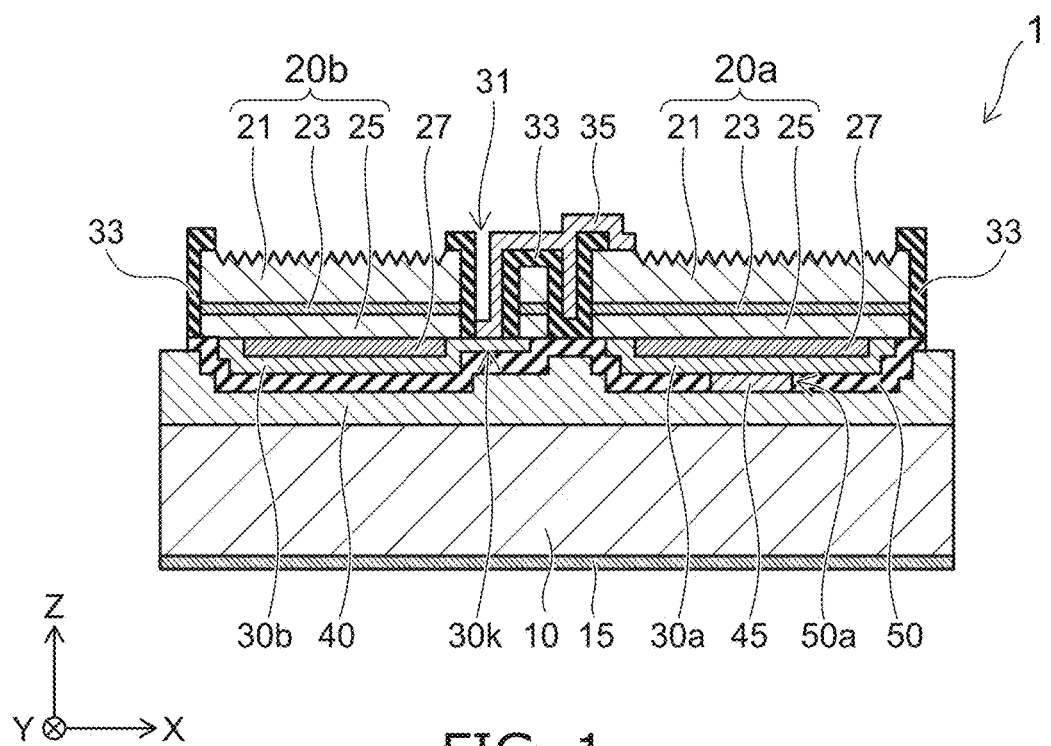
FIG. 1 is a cross-sectional view showing a semiconductor light emitting device according to a first embodiment.

According to one embodiment, a semiconductor light emitting device includes a conductive substrate, light emitting bodies, a first electrode, a second electrode and a first interconnection. The light emitting bodies are disposed side by side on the conductive substrate, the light emitting bodies each including a first semiconductor layer of a first conductivity type, a second semiconductor layer of a second conductivity type, and a light emitting layer provided between the first semiconductor layer and the second semiconductor layer, and the light emitting bodies including a first light emitting body electrically connected to the substrate and a second light emitting body electrically connected in series to the first light emitting body. The first electrode is provided between the first light emitting body and the conductive substrate, and electrically connected to the first semiconductor layer of the first light emitting body and the conductive substrate. The second electrode is provided between the second light emitting body and the conductive substrate, and electrically connected to the first semiconductor layer of the second light emitting body. The first interconnection electrically connects the second semiconductor layer of the first light emitting body and the second electrode, the first interconnection including a first portion and a second portion, the first portion extending over the first light emitting body and the second light emitting body, and a second portion extending into the second light emitting body and being electrically connected to the second electrode.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

The embodiments are described as examples, and not limited thereto. Further, the features described in each embodiment can be applied in common if technically possible. Although the first conductivity type is described as n-type and the second conductivity type is described as p-type in the following embodiments, there may be a case where the first conductivity type is p-type and the second conductivity type is n-type.

First Embodiment

Figure 2A:
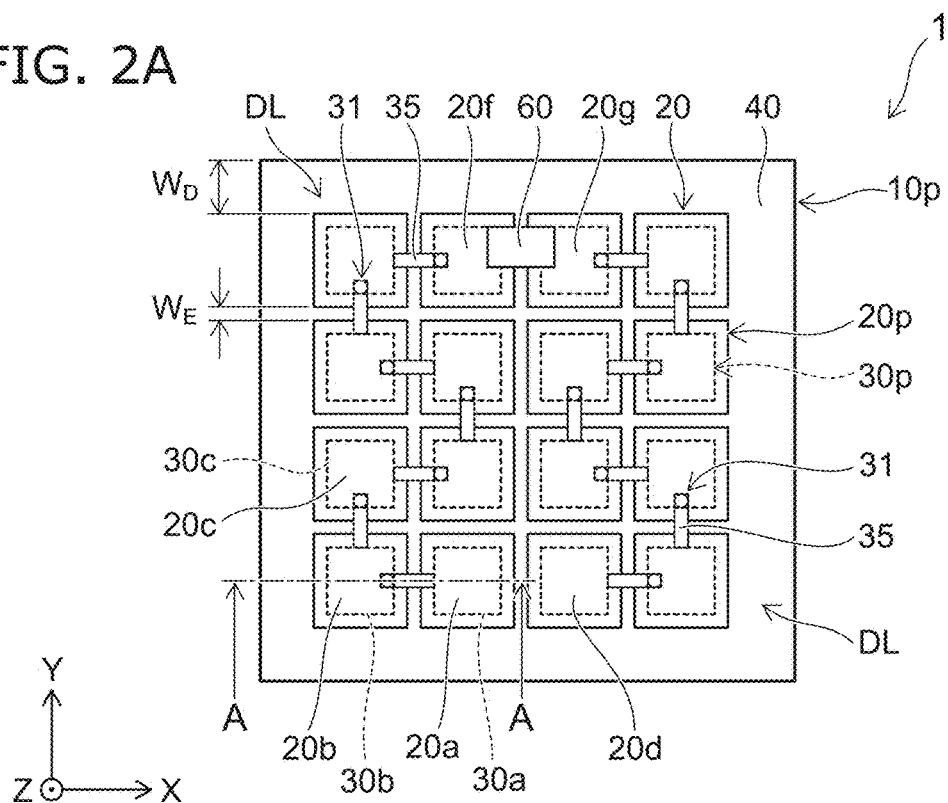
FIGS. 2A and 2B are a top view and an equivalent circuit showing the semiconductor light emitting device according to the first embodiment.
Figure 2B:
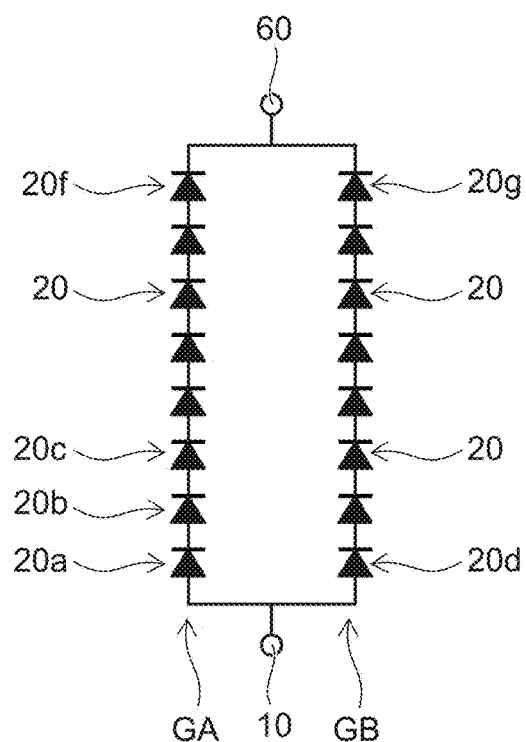

FIG. 1 is a cross-sectional view showing a semiconductor light emitting device 1 according to a first embodiment. FIG. 2A is a top view showing the semiconductor light emitting device 1. FIG. 1 is a cross-sectional view taken along the A-A line shown in FIG. 2A. Further, FIG. 2B is an equivalent circuit showing the semiconductor light emitting device 1.

As shown in FIG. 1, the semiconductor light emitting device 1 includes a substrate 10, a first light emitting body (hereinafter referred to as "light emitting body 20a"), and a second light emitting body (hereinafter referred to as "light emitting body 20b"). The substrate 10 is conductive and, for example, a silicon substrate. The light emitting bodies 20a and 20*b* each include an n-type semiconductor layer 21, a light emitting layer 23, and a p-type semiconductor layer 25. The light emitting layer 23 is provided between the n-type semiconductor layer 21 and the p-type semiconductor layer 25.

The n-type semiconductor layer 21 includes, for example, an n-type gallium nitride layer (GaN layer). Further, the n-type semiconductor layer 21 may further include a buffer layer containing GaN, aluminum nitride (AlN), aluminum gallium nitride (AlGaN), or the like. In this case, the n-type GaN layer is provided between the buffer layer and the light emitting layer 23.

The light emitting layer 23 includes, for example, a quantum well constituted by a well layer of indium gallium nitride (InGaN) and a barrier layer of GaN. Further, the light emitting layer 23 may have a multiple quantum well structure including a plurality of quantum wells.

The p-type semiconductor layer 25 has, for example, a stacked structure of a p-type AlGaN layer and a p-type GaN layer. The p-type AlGaN layer is formed on the light emitting layer 23, and the p-type GaN layer is formed on the p-type AlGaN layer.

The semiconductor light emitting device 1 further includes a p-side contact layer 27, a first electrode (hereinafter referred to as "p-side electrode 30*a*"), and a second electrode (hereinafter referred to as "p-side electrode 30*b*"). Each of the light emitting bodies 20*a* and 20*b* includes the p-type semiconductor layer 25 that is electrically connected to the p-side contact layer 27. The p-side electrodes 30*a* and 30*b* each cover the p-side contact layer 27 on a surface of the p-type semiconductor layer 25. The p-side electrode 30*a* is electrically connected to the p-type semiconductor layer 25 of the light emitting body 20*a* via the p-side contact layer 27. The p-side electrode 30*b* is electrically connected to the p-type semiconductor layer 25 of the light emitting body 20*b* via another p-side contact layer 27.

Preferably used for the p-side contact layer 27 is a material, which has a small contact resistance when contacting with the p-type semiconductor layer 25, and has a high reflectance in the wavelength range of light emitted from the light emitting layer 23. The p-side contact layer 27 is, for example, a metal layer containing silver (Ag). Used for the p-side electrodes 30*a* and 30*b* is a material, for example, aluminum that has the high reflectance for the light emitted from the light emitting layer 23.

The light emitting bodies 20*a* and 20*b* are provided on the substrate 10 via a bonding layer 40 and an insulating layer 50. The bonding layer 40 is conductive and provided between the substrate 10 and the insulating layer 50. The p-side electrode 30*a* and the p-side contact layer 27 are disposed between the insulating layer 50 and the light emitting body 20*a*. The p-side electrode 30*b* and the p-side contact layer 27 are disposed between the insulating layer 50 and the light emitting body 20*b*.

The insulating layer 50 includes a contact hole 50*a* that is in communication with the p-side electrode 30*a*. In the inside of the contact hole 50*a*, for example, a conductive body 45 is provided to electrically connect the p-side electrode 30*a* to the bonding layer 40. That is, the light emitting body 20*a* is electrically connected to the substrate 10 through the p-side contact layer 27, the p-side electrode 30*a*, the conductive body 45, and the bonding layer 40. On the other hand, the light emitting body 20*b* is electrically insulated from the bonding layer 40 and the substrate 10 by the insulating layer 50. The embodiment is not limited thereto, and for example, a structure in which the conductive body 45 is not provided, may be adopted, where a portion of the bonding layer 40 extends into the contact hole 50*a*, and the bonding layer 40 is directly connected to the p-side electrode 30*a*.

The semiconductor light emitting device 1 further includes an interconnection 35 which electrically connects the n-type semiconductor layer 21 of the light emitting body 20*a* and the p-side electrode 30*b*. The light emitting body 20*b* includes a contact hole 31 that is in communication with the p-side electrode 30*b* from an upper surface thereof. One end of the interconnection 35 extends into the contact hole 31 provided in the light emitting body 20*b* and is connected to the p-side electrode 30*b*. Further, the other end of the interconnection 35 on a side of the light emitting body 20*a* extends and is connected to the n-type semiconductor layer 21 of the light emitting body 20*a*. Thus, the light emitting body 20*b* is connected in series to the light emitting body 20*a*.

The interconnection 35 is formed on the insulating layer 33. The insulating layer 33 covers a portion of an upper surface of each light emitting body 20*a*, 20*b*, side surfaces thereof, and an inner wall of the contact hole 31. The insulating layer 33 electrically insulates the interconnection 35 from the n-type semiconductor layer 21, the light emitting layer 23, and the p-type semiconductor layer 25 of the light emitting body 20*b*. Further, the insulating layer 33 electrically insulates the interconnection 35 from the light emitting layer 23 and the p-type semiconductor layer 25 of the light emitting body 20*a*. The interconnection 35 preferably includes, for example, a gold (Au) layer as an outermost surface thereof.

FIG. 2A is a schematic view showing an arrangement of the light emitting bodies 20 in an upper surface (hereinafter referred to as "chip surface") of the semiconductor light emitting device 1. The semiconductor light emitting device 1 includes a plurality of light emitting bodies 20 and an n-side bonding pad 60. The adjacent light emitting bodies 20 are electrically connected to each other through the interconnection 35. Further, two or more interconnections 35 may be disposed to electrically connect the adjacent light emitting bodies 20. Thus, an electric current may be decreased, which flow through each of the interconnections 35.

The plurality of light emitting bodies 20 further includes, for example, a third light emitting body (hereinafter referred to as "light emitting body 20*c*") connected in series to the light emitting bodies 20. A third electrode (hereinafter referred to as "p-side electrode 30*c*") is provided between the substrate 10 and the light emitting body 20*c*. Then, the n-type semiconductor layer 21 of the light emitting body 20*b* is electrically connected to the p-side electrode 30*c* through an interconnection 35. The interconnection 35 is connected to the p-side electrode 30*c* through a contact hole 31 provided in the light emitting body 20*c*.

As shown in FIG. 2B, the plurality of light emitting bodies 20, for example, are divided into two light emitting body groups GA and GB. The light emitting body groups GA and GB each include eight light emitting bodies 20 connected in series. The light emitting body groups GA and GB are connected in parallel to the substrate 10 and the n-side bonding pad 60. For example, the light emitting bodies 20*a* and 20*d* are located at one end of the series connection of each light emitting body group GA or GB, and electrically connected to the substrate 10.

The light emitting bodies 20*a* and 20*d* have the same structure and each are electrically connected to the substrate 10 through the conductive body 45 (see FIG. 1). Further, the light emitting bodies 20*f* and 20*g* are located at the other end of the series connection of each light emitting body groups GA or GB, and are electrically connected to the n-side bonding pad 60.

As shown in FIG. 2A, the n-side bonding pad 60 is provided over the light emitting bodies 20f and 20g. The n-side bonding pad 60 is electrically connected on a cathode side of the light emitting bodies 20f and 20g, for example, to the n-type semiconductor layer 21.

In the semiconductor light emitting device 1, one end of the light emitting bodies 20 connected in series is electrically connected to the substrate 10, and the other end is electrically connected to the n-side bonding pad 60 that is disposed on the chip surface. Thus, one of bonding pads on an anode side and a cathode side can be omitted from the chip surface, and a light emitting area of the light emitting bodies 20 can be enlarged. For example, in order to dispose a bonding pad with a diameter of 100 μm on the chip surface, it is necessary to provide a non-light emitting region with a diameter of about 140 μm. This corresponds to 3% of the area of a light emitting region in a semiconductor light emitting device with a chip size of 1 mm square.

FIGS. 12A to 12D are graphs showing an area ratio of the bonding pad to the light emitting body 20. In this case, the semiconductor light emitting bodies 20 are assumed to have the same size on each chip surface. The horizontal axis represents the number of light emitting bodies 20 disposed on the substrate 10. The vertical axis represents the area ratio of the bonding pad to one light emitting body 20. In each graph, PA1 shows a case where the number of bonding pads disposed on the substrate 10 is 1; and PA2 shows a case where the number of bonding pads disposed on the substrate 10 is 2.

Figure 12A:
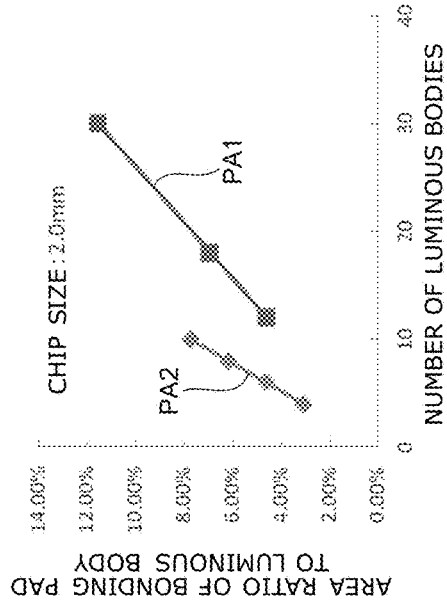
FIGS. 12A to 12D are graphs each showing an area ratio of a bonding pad to a light emitting body.
Figure 12B:
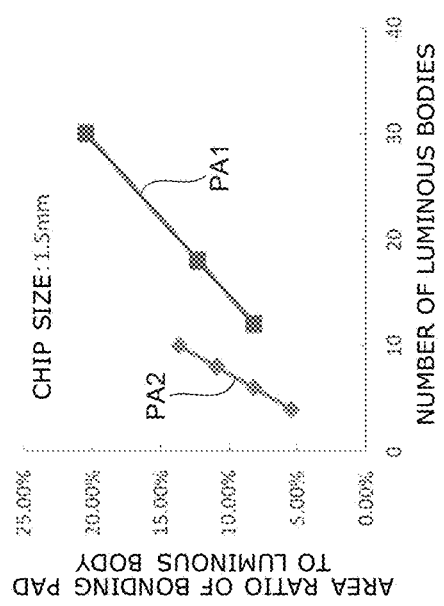
Figure 12C:
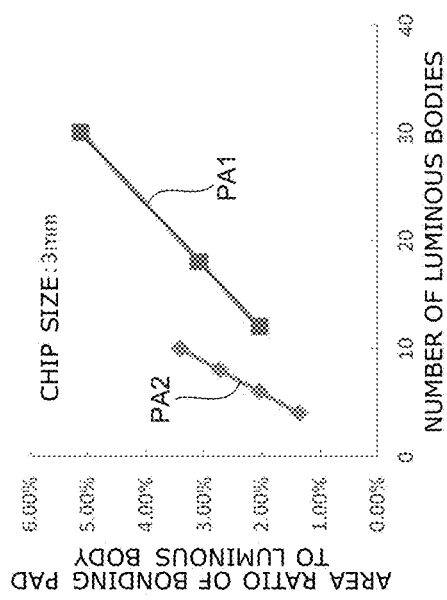
Figure 12D:
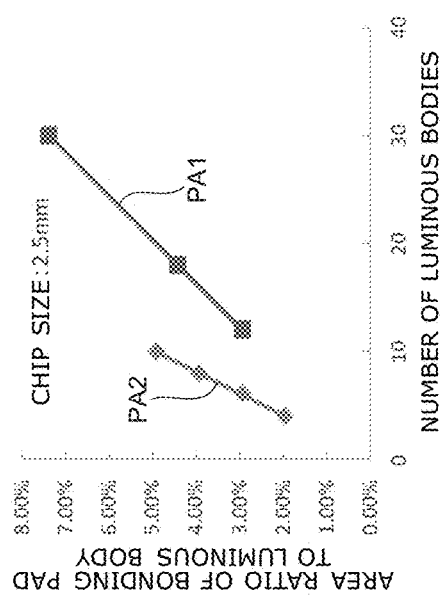

FIG. 12A is the graph which shows a case where the size of one side of the substrate 10, i.e. the chip size is 3 mm. The chip sizes in FIGS. 12B, 12C, and 12D are 2.5 mm, 2.0 mm, and 1.5 mm, respectively. As shown in FIGS. 12A to 12D, as the number of light emitting bodies 20 increases, the area ratio of the bonding pad to the light emitting body 20 increases. When the number of bonding pads is reduced from 2 to 1, the area ratio of the bonding pad to the light emitting body 20 becomes smaller. Further, the area ratio of the bonding pad to the light emitting body 20 becomes larger as the chip size becomes smaller.

As shown in FIG. 2A, the light emitting bodies 20 are preferably provided with the same size. For example, it is preferred for the light emitting bodies 20 connected in series to have the light emitting layers 23 with the same area so that the driving current densities is equal in each light emitting layer 23. Thus, luminance becomes uniform over the light emitting bodies 20, providing uniform distribution of the luminance on the chip surface. For example, when a plurality of light emitting bodies 20 with different sizes is disposed, an electric current density in the light emitting body 20 with a smaller size becomes larger and the luminance thereof may become lower. Further, electro-migration or the like may be induced with higher probability in a portion where an electric current density becomes larger. Thus, the uniform luminance and high reliability are achieved in the semiconductor light emitting device 1 by providing the light emitting bodies 20 with the same size.

Further, a distance $W_E$ between the adjacent light emitting bodies 20 is preferably made narrower than a width $W_D$ of a dicing line DL surrounding the plurality of light emitting bodies 20. Thus, the semiconductor light emitting device 1 may have smaller size. Further, reducing the low luminance region between the adjacent light emitting bodies 20 provides the uniform luminance. In addition, the device is preferably formed such that an outer periphery 30p of each p-side electrode 30 is, for example, located under the light emitting body 20 on the chip surface.

Figure 3:
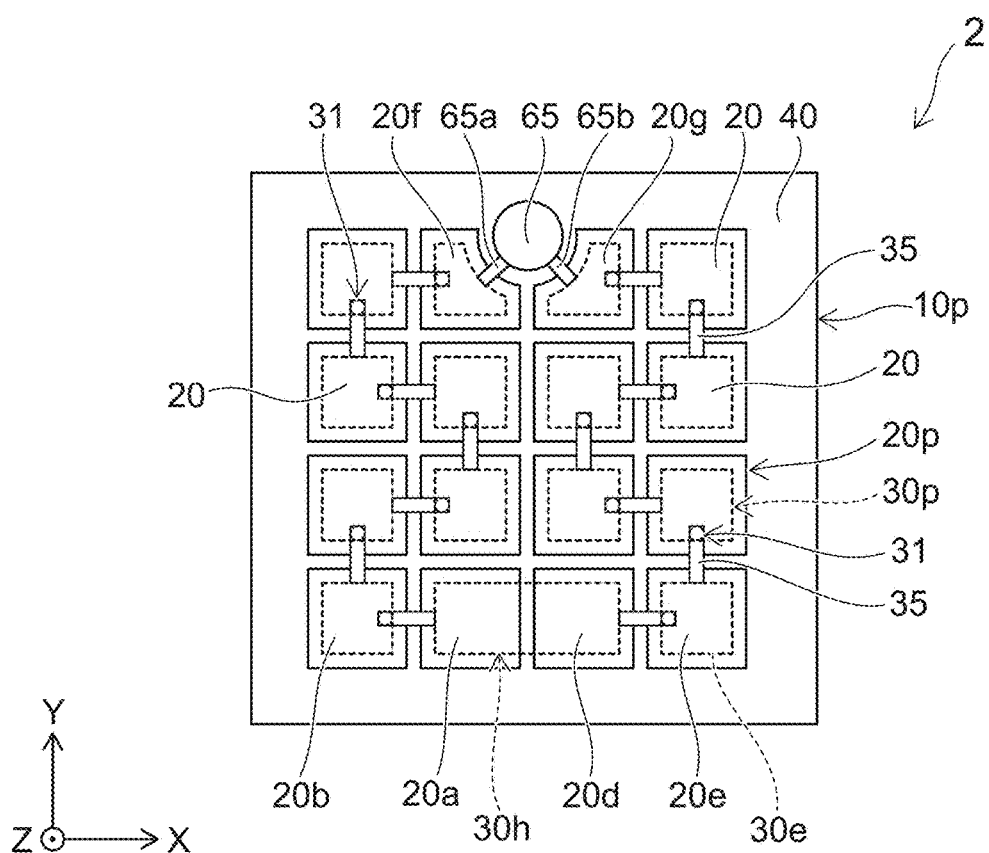
FIG. 3 is a top view showing a semiconductor light emitting device according to a variation of the first embodiment.

FIG. 3 is a top view showing a semiconductor light emitting device 2 according to a variation of the first embodiment. The semiconductor light emitting device 2 includes a plurality of light emitting bodies 20 and an n-side bonding pad 65. The plurality of light emitting bodies 20 are divided into the light emitting body groups GA and GB. The light emitting body groups GA and GB are connected in parallel to a substrate 10 (not shown) and the n-side bonding pad 65 (see FIG. 2B).

The n-side bonding pad 65 is disposed adjacent to the light emitting bodies 20f and 20g in the chip surface. Then, the n-side bonding pad 65 is electrically connected to n-type semiconductor layers 21 in the light emitting bodies 20f and 20g through interconnections 65a and 65b.

Further, in this example, a light emitting body 20a shares a p-side electrode 30h with a light emitting body 20d. The p-side electrode 30h is provided between the substrate 10 and the light emitting body 20a and between the substrate 10 and the light emitting body 20d. Further, the p-side electrode 30h is electrically connected to the substrate 10 through a contact hole 50a of an insulating layer 50 (see FIG. 1).

The plurality of light emitting bodies 20 further includes a light emitting body 20e connected in series to the light emitting body 20d. A p-side electrode 30e is provided between the substrate 10 and the light emitting body 20e. Then, the n-type semiconductor layer 21 of the light emitting body 20d is electrically connected to the p-side electrode 30e through an interconnection 35. The interconnection 35 is connected to the p-side electrode 30e through a contact hole 31 provided in the light emitting body 20e.

Next, with reference to FIGS. 4A to 7B, a method for manufacturing the semiconductor light emitting device 1 according to the first embodiment will be described. FIGS. 4A to 7B are cross-sectional views sequentially showing a process for manufacturing the semiconductor light emitting device 1.

Figure 4A:
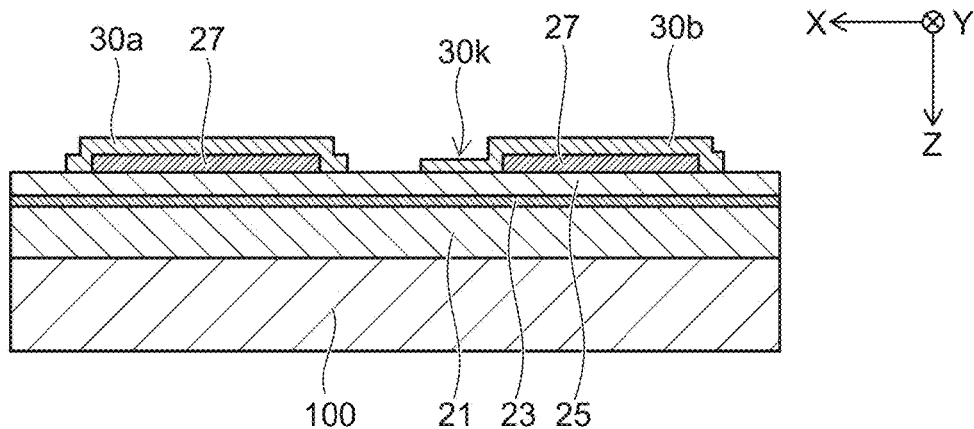
FIGS. 4A to 7B are cross-sectional views showing a manufacturing process of the semiconductor light emitting device according to the first embodiment.

As shown in FIG. 4A, an n-type semiconductor layer 21, a light emitting layer 23, and a p-type semiconductor layer 25 are sequentially stacked on a substrate 100. In the specification, a term "stacked" represents not only a case where the layers are in direct contact with each other, but also a case where other component is inserted therebetween.

The substrate 100 is, for example, a silicon substrate. The substrate 100 may be a sapphire substrate. The n-type semiconductor layer 21, the light emitting layer 23, and the p-type semiconductor layer 25 each contain a nitride semiconductor. The n-type semiconductor layer 21, the light emitting layer 23, and the p-type semiconductor layer 25 each may contain a material represented by a formula $Al_xGa_{1-x-y}In_yN$ (x≥0, y≥0, x+y≥1).

The n-type semiconductor layer 21 includes, for example, an n-type GaN contact layer doped with silicon (Si) which is an n-type impurity, and an n-type AlGaN cladding layer doped with Si. The n-type AlGaN cladding layer is disposed, for example, between the n-type GaN contact layer and the light emitting layer 23. The n-type semiconductor layer 21 may further include a buffer layer. For example, the n-type GaN contact layer is disposed between the buffer layer and the n-type AlGaN cladding layer. The buffer layer may contain at least one of AlN, AlGaN and GaN.

The light emitting layer 23 has, for example, a multiple quantum well (MQW) structure. A plurality of barrier layers and a plurality of well layers are alternately stacked in the MQW structure. AlGaInN or GaInN may be used as a material of the well layer. N-type AlGaN doped with Si or n-type $Al_{0.1}Ga_{0.9}N$ doped with Si may be used as a material of the barrier layer. The barrier layer may have a thickness of 2 nm or more and 30 nm or less. A barrier layer (p-side barrier layer) closest to the p-type semiconductor layer 25 among the plurality of barrier layers may have a different composition or thickness from that of the other barrier layers.

A light emitted from the light emitting layer 23 may have a peak wavelength of 210 nm or more and 700 nm or less in the spectrum thereof. The peak wavelength of the light may be 370 nm or more and 480 nm or less in other case.

The p-type semiconductor layer 25 includes, for example, a non-doped AlGaN spacer layer, a p-type AlGaN cladding layer doped with magnesium (Mg) which is a p-type impurity, a p-type GaN layer doped with Mg, and a p-type GaN contact layer doped with a higher concentration of Mg. The p-type GaN layer is disposed between the p-type GaN contact layer and the light emitting layer 23. The p-type AlGaN cladding layer is disposed between the p-type GaN layer and the light emitting layer 23. The AlGaN spacer layer is disposed between the p-type AlGaN cladding layer and the light emitting layer 23. For example, the p-type semiconductor layer 25 includes an $Al_{0.11}Ga_{0.89}N$ spacer layer, a p-type $Al_{0.28}Ga_{0.72}N$ cladding layer, a p-type GaN layer, and a p-type GaN contact layer.

Further, a p-side contact layer 27 and p-side electrodes 30a and 30b are selectively formed on the p-type semiconductor layer 25. The p-side contact layer 27 is a metal layer, which contains Ag, for example, and is formed using a vacuum deposition method. The p-side electrodes 30a and 30b each cover the p-side contact layer 27. Each of the p-side electrodes 30a and 30b is a metal layer containing aluminum (Al), for example, and is formed using a vacuum deposition method.

Figure 4B:
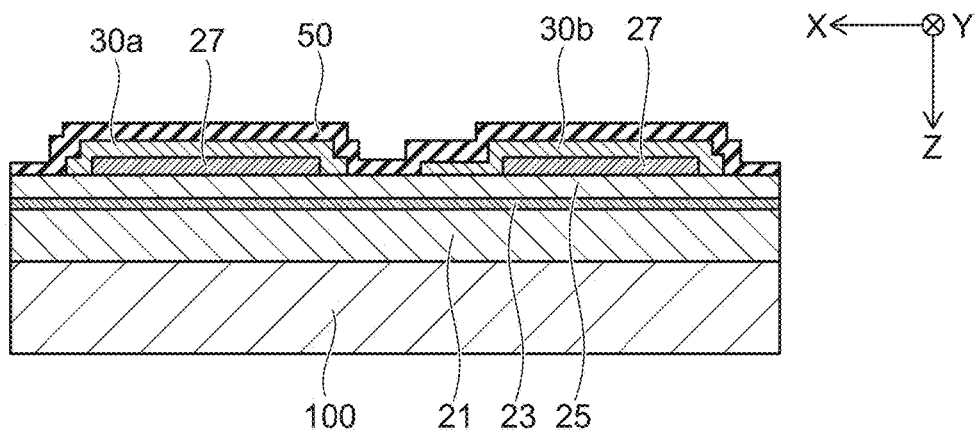

As shown in FIG. 4B, an insulating layer 50 is formed to cover the surfaces of the p-side electrodes 30a, 30b and the p-type semiconductor layer 25. The insulating layer 50 is, for example, a silicon oxide layer or a silicon nitride layer formed using CVD (Chemical Vapor Deposition). Further, the insulating layer 50 may have a stacked structure which includes a silicon oxide layer and a silicon nitride layer.

Figure 4C:
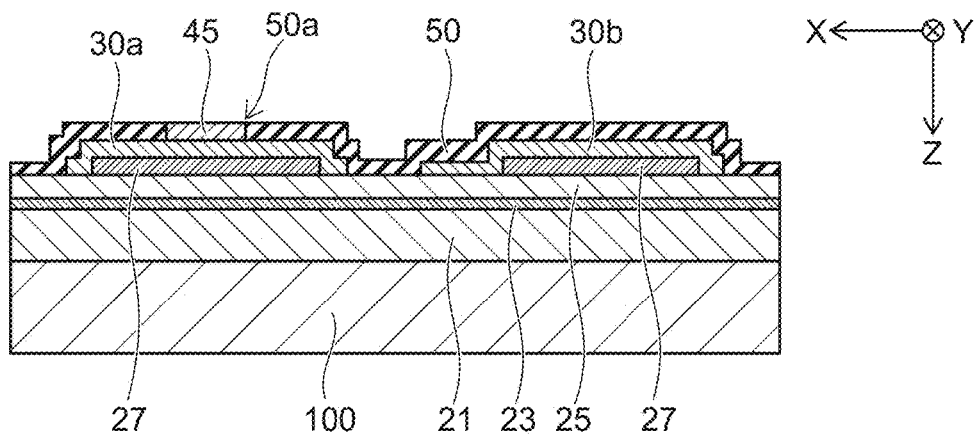

As shown in FIG. 4C, a contact hole 50a is formed in the insulating layer 50, and a conductive body 45 is embedded therein. The conductive body 45 contains, for example, aluminum (Al) or titanium nitride (TiN).

Figure 5A:
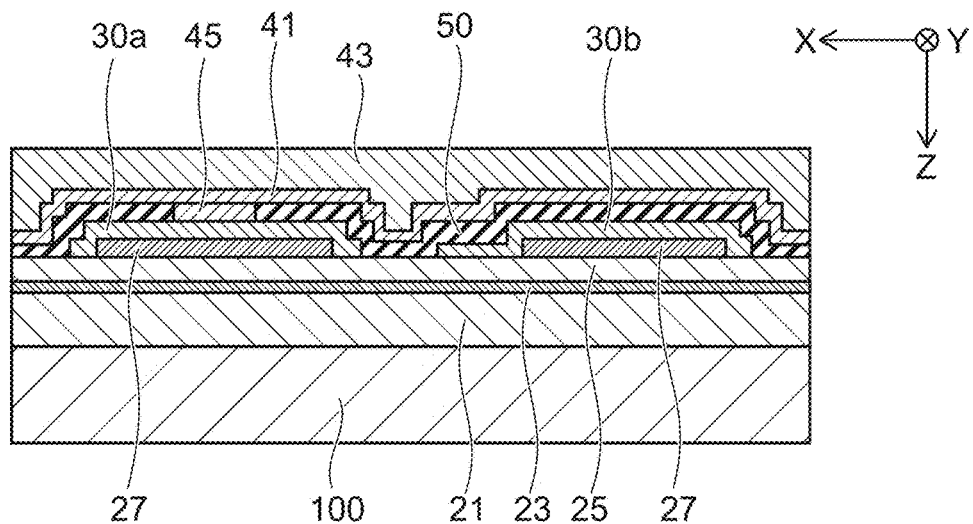

As shown in FIG. 5A, metal layers 41 and 43 are formed on the insulating layer 50 and the conductive body 45. The metal layer 41 contains, for example, at least one of Ti, Pt, and Ni. Further, the metal layer 43 contains a bonding metal such as a solder material. The metal layer 43 is, for example, made of solder alloy, which contains at least one of Ni—Sn, Au—Sn, Bi—Sn, Sn—Cu, Sn—In, Sn—Ag, Sn—Pb, Pb—Sn—Sb, Sn—Sb, Sn—Pb—Bi, Sn—Pb—Cu, Sn—Pb—Ag and Pb—Ag.

Figure 5B:
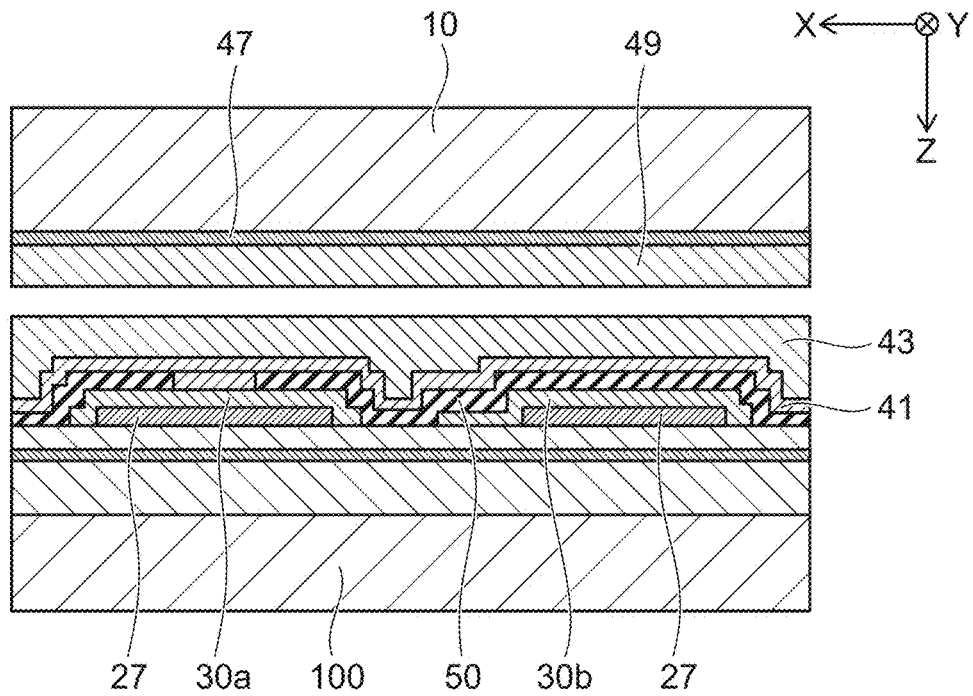

As shown in FIG. 5B, a substrate 10 is disposed on an upper side of the metal layer 43. The substrate 10 includes metal layers 47 and 49 on a surface facing the metal layer 43. The metal layer 47 contains, for example, at least one of Ti, Pt, and Ni. Further, the metal layer 49 contains a bonding metal such as a solder material. The metal layer 49 is, for example, made of solder alloy, which contains at least one of Ni—Sn, Au—Sn, Bi—Sn, Sn—Cu, Sn—In, Sn—Ag, Sn—Pb, Pb—Sn—Sb, Sn—Sb, Sn—Pb—Bi, Sn—Pb—Cu, Sn—Pb—Ag and Pb—Ag.

Subsequently, the metal layer 49 is bonded to the metal layer 43. For example, the metal layer 49 is bonded to the metal layer 43 under prescribed pressure and the temperature equal to or more than the melting point of the bonding metal. Thus, the metal layer 43 and the metal layer 49 are fused into one body, whereby the substrate 10 is bonded to the upper side of the substrate 100.

Figure 6A:
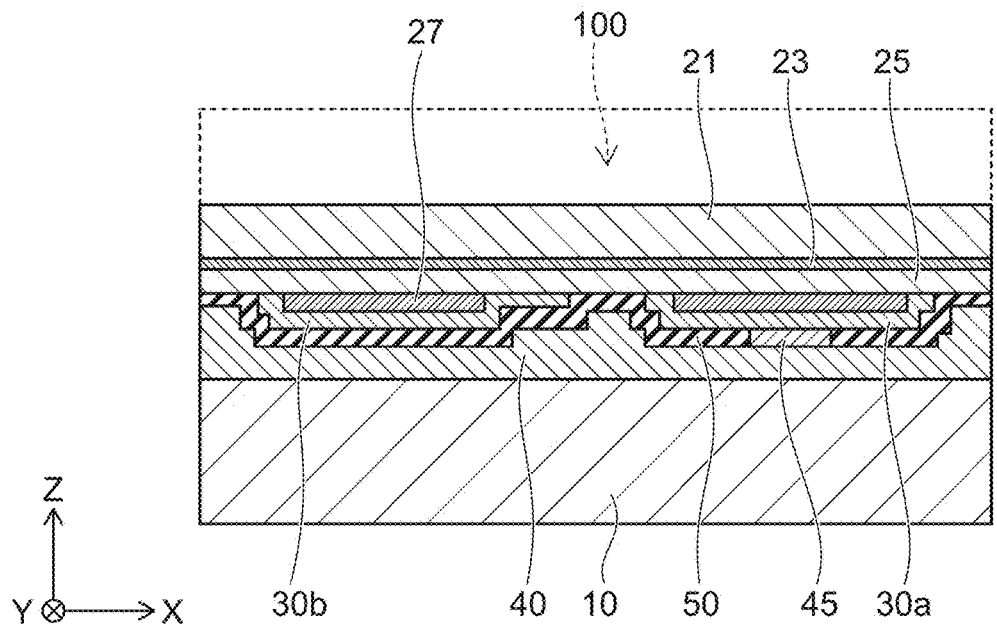

As shown in FIG. 6A, the substrate 100 is removed, and the n-type semiconductor layer 21, the light emitting layer 23, and the p-type semiconductor layer 25 are transferred to the substrate 10. A bonding layer 40 includes metal layers 41, 43, 47 and 49, in which the metal layers 43 and 47 are fused into one body.

The substrate 100 is removed using, for example, a method such as grinding and etching, such as RIE (Reactive Ion Etching). When the substrate 100 is a sapphire substrate, the substrate is removed using, for example, LLO (Laser Lift Off).

Figure 6B:
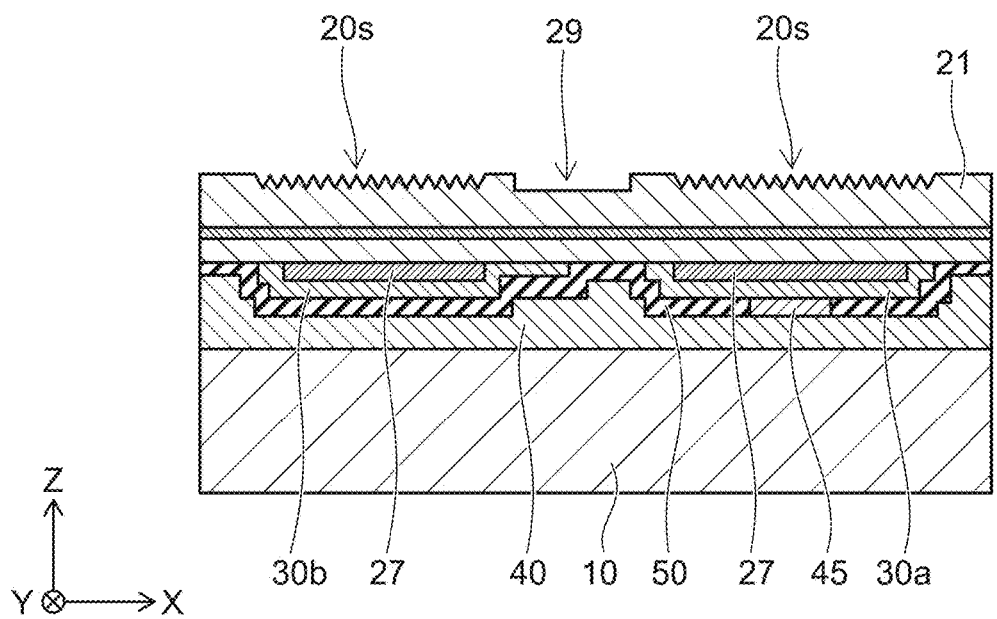

As shown in FIG. 6B, a surface of the n-type semiconductor layer 21 is selectively etched, for example, by a dry etching using gas that contains chlorine. In addition, a portion of the n-type semiconductor layer 21, which becomes the surface of the light emitting body 20 (surface 20s), is roughened by wet etching. Thus, the light extraction efficiency from the light emitting body 20 is enhanced by the roughened surface thereof. Further, an interconnecting portion 29, on which the interconnection 35 is provided, is formed to have lower height so that a thickness in the Z-direction of the n-type semiconductor layer 21 becomes thinner than that of the other portion. Thereby, it becomes possible to avoid disconnections at the edges of the interconnecting portion 29, when forming the interconnection 35 thereon.

Figure 7A:
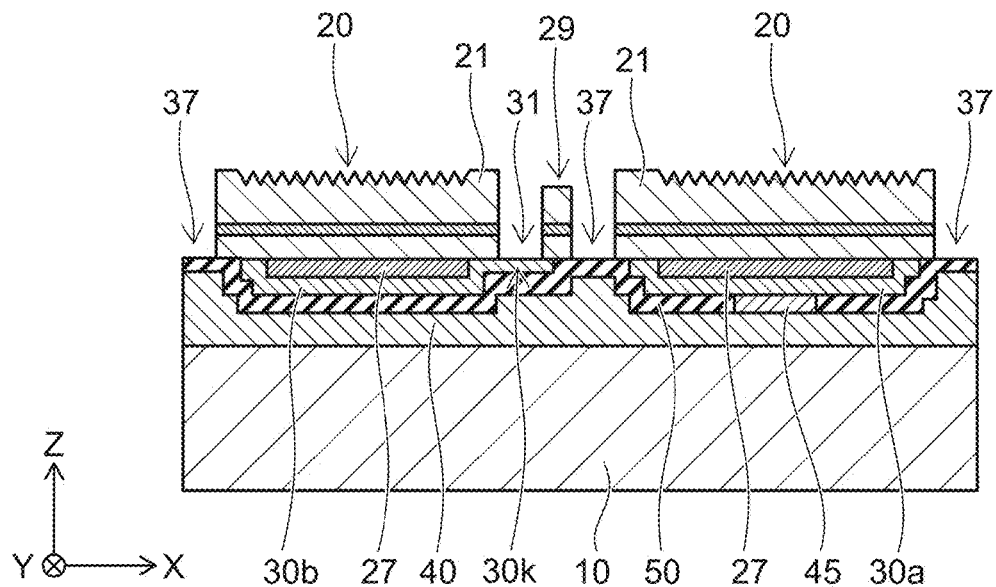

As shown in FIG. 7A, the n-type semiconductor layer 21, the light emitting layer 23, and the p-type semiconductor layer 25 are selectively removed and divided into a plurality of light emitting bodies 20. For example, the n-type semiconductor layer 21, the light emitting layer 23, and the p-type semiconductor layer 25 are selectively removed using a method such as RIE or wet etching to form a groove 37. A surface of the insulating layer 50 is exposed on a bottom surface of the groove 37. The groove 37 divides the n-type semiconductor layer 21, the light emitting layer 23 and the p-type semiconductor layer 25 into light emitting bodies 20. Preferably, a contact hole 31 is formed simultaneously with the groove 37. The contact hole 31 is, for example, formed from the upper surface of the light emitting body 20b to have a depth capable of reaching the p-side electrode 30. The contact hole 31 is in communication with an extended portion 30k of the p-side electrode 30.

Figure 7B:
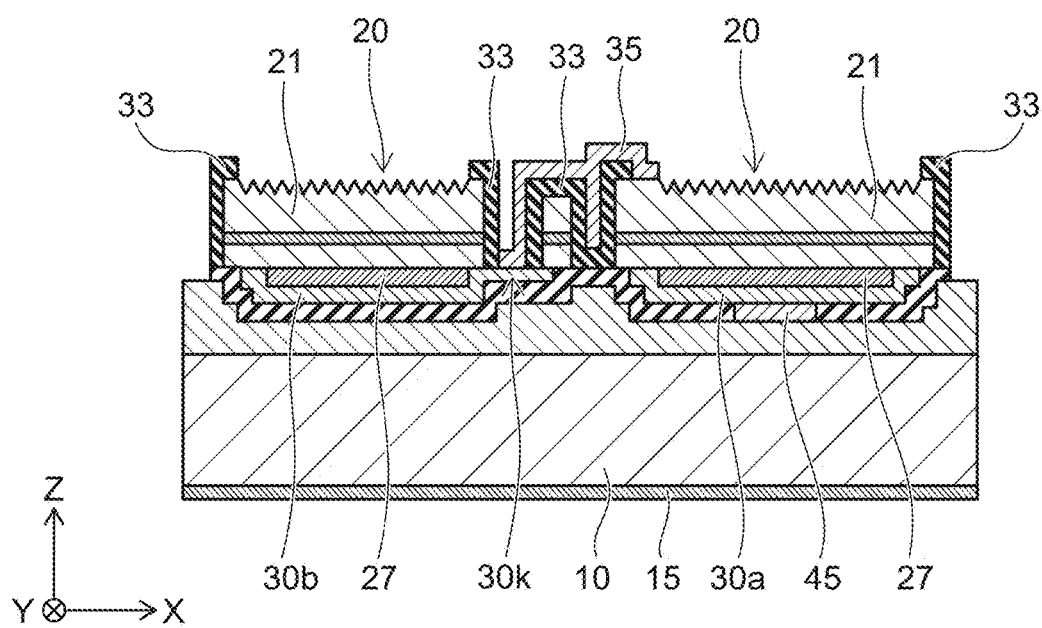

As shown in FIG. 7B, the interconnection 35 is formed to connect the light emitting bodies 20 in series. At the same time, an n-side bonding pad 60 (see FIG. 2A) is formed over the light emitting bodies 20. For example, an insulating layer 33 is formed to cover the plurality of light emitting bodies 20 and the insulating layer 50. The insulating layer 33 is, for example, a silicon oxide layer which is formed using plasma CVD. Subsequently, the insulating layer 33 is selectively removed, for example, using anisotropic dry etching to expose the surface 20s of the light emitting body 20. At the same time, the extended portion 30k of the p-side electrode 30 is exposed on a bottom surface of the contact hole 31. Subsequently, a metal layer which provides the interconnection 35 is formed over the light emitting bodies 20, and then, the metal layer is selectively removed to form the interconnection 35 and the n-side bonding pad 60. The interconnection 35 and the n-side bonding pad 60 each have, for example, a structure in which a plurality of metal layers are stacked, and are formed so as to include an Au layer that provides an outermost surface of the interconnection 35.

Further, a metal layer 15 is formed on a rear surface of the substrate 10. For example, the substrate 10 is ground on a rear surface side to have a predetermined thickness, and then, titanium (Ti), platinum (Pt), and gold (Au) are sequentially deposited on the substrate to form the metal layer 15.

In the embodiment, by using the conductive substrate 10, a Joule heat generated in the light emitting body 20 can be dissipated through the substrate 10 and the metal layer 15. Further, downsizing the semiconductor light emitting device 1 is achieved by omitting a p-side bonding pad on the chip surface.

Second Embodiment

Figure 8:
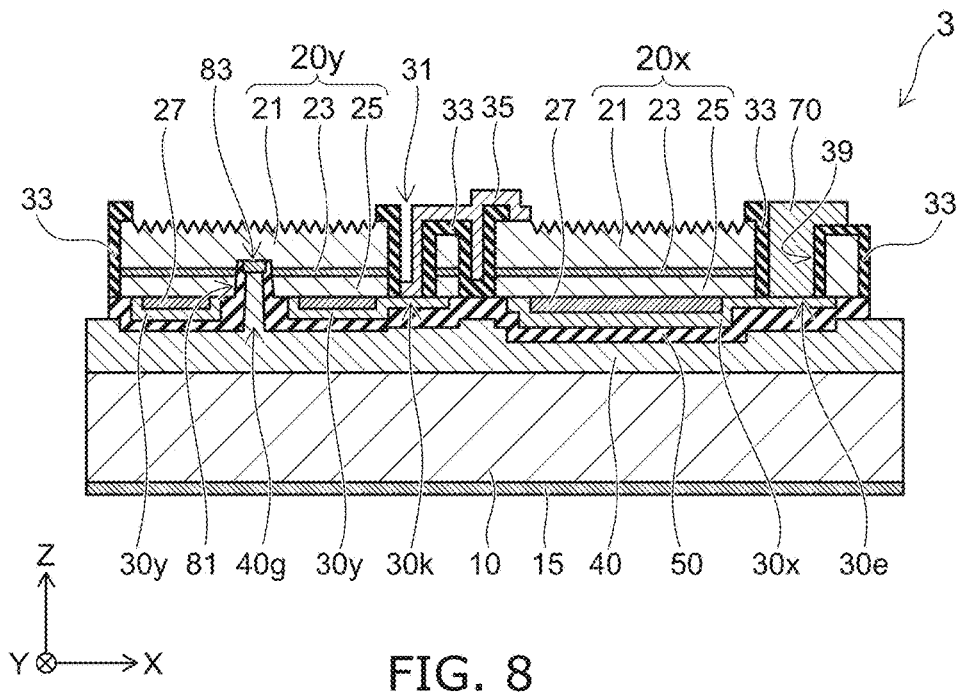
FIG. 8 is a cross-sectional view showing a semiconductor light emitting device according to a second embodiment.

FIG. 8 is a schematic cross-sectional view showing a semiconductor light emitting device 3 according to a second embodiment. The semiconductor light emitting device 3 includes a substrate 10, a light emitting body 20x, and a light emitting body 20y. The light emitting bodies 20x and 20y each include an n-type semiconductor layer 21, a light emitting layer 23, and a p-type semiconductor layer 25.

The semiconductor light emitting device 3 further includes a p-side contact layer 27, a p-side electrode 30x, and a p-side electrode 30y. Each of the light emitting bodies 20x and 20y has the p-side contact layer 27 electrically connected to the p-type semiconductor layer 25. The p-side electrodes 30x and 30y each cover the p-side contact layer 27 on a surface of the p-type semiconductor layer 25. The p-side electrode 30x is electrically connected to the p-type semiconductor layer 25 of the light emitting body 20x through the p-side contact layer 27. The p-side electrode 30y is electrically connected to the p-type semiconductor layer 25 of the light emitting body 20y through another p-side contact layer 27.

The light emitting bodies 20x and 20y are provided on the substrate 10 through a bonding layer 40 and an insulating layer 50. The bonding layer 40 has conductivity and is provided between the substrate 10 and the insulating layer 50. The p-side electrode 30x and the p-side contact layer 27 are disposed between the insulating layer 50 and the light emitting body 20x. The p-side electrode 30y and the p-side contact layer 27 are disposed between the insulating layer 50 and the light emitting body 20y.

Further, the light emitting body 20y includes a recess portion 81 extending through the light emitting layer 23 from a surface of the p-type semiconductor layer 25 to reach the n-type semiconductor layer 21. Then, an n-side electrode 83 is provided on a bottom surface of the recess portion 81. The n-side electrode 83 is electrically connected to the n-type semiconductor layer 21. The n-side electrode 83 is, for example, a metal layer containing aluminum. The insulating layer 50 extends into the recess portion 81 and covers a wall surface thereof. Further, the bonding layer 40 includes a portion extending into the recess portion 81 (hereinafter, an extended portion 40g). The extended portion 40g is electrically connected to the n-side electrode 83. That is, the n-type semiconductor layer 21 of the light emitting body 20y is electrically connected to the substrate 10 through the n-side electrode 83 and the bonding layer 40.

On the other hand, the p-side electrode 30x provided between the light emitting body 20x and the substrate 10 is electrically insulated from the bonding layer 40 and the substrate 10 by the insulating layer 50. That is, the light emitting body 20x is electrically insulated from the substrate 10. Further, the p-side electrode 30x includes an extension portion 30e electrically connected to a p-side bonding pad 70.

The semiconductor light emitting device 3 further includes an interconnection 35 which electrically connects the n-type semiconductor layer 21 of the light emitting body 20x and the p-side electrode 30y. The light emitting body 20y includes a contact hole 31 which is in communication with the p-side electrode 30y from an upper surface thereof. One end of the interconnection 35 extends into the contact hole 31 provided in the light emitting body 20y and is electrically connected to the p-side electrode 30y. Further, the other end of the interconnection 35 extends on a side of the light emitting body 20x and is electrically connected to the n-type semiconductor layer 21 of the light emitting body 20x. Accordingly, the light emitting body 20y is connected in series to the light emitting body 20x.

The light emitting body 20y is connected in series to the light emitting body 20x, however, three or more light emitting bodies 20 may be connected in series by interposing another light emitting body 20 between the light emitting body 20y and the light emitting body 20x.

In this manner, the n-type semiconductor layer 21 of the light emitting body 20 is electrically connected to the substrate 10, and the p-side bonding pad 70 may be disposed on the chip surface, which is electrically connected to the p-side electrode 30. Accordingly, a bonding pad electrically connected to the n-type semiconductor layer 21 is omitted on the chip surface, enlarging a luminous area in the chip surface. Further, downsizing the semiconductor light emitting device 3 may be easily achieved in the embodiment.

Third Embodiment

Figure 9:
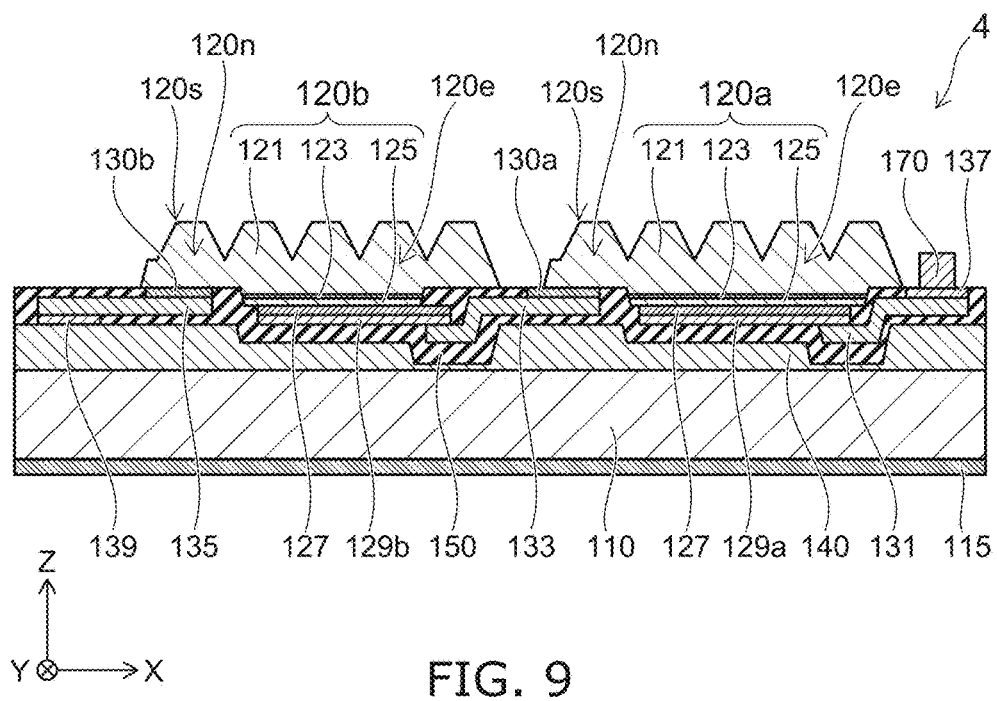
FIG. 9 is a cross-sectional view showing a semiconductor light emitting device according to a third embodiment.

FIG. 9 is a schematic cross-sectional view showing a semiconductor light emitting device 4 according to a third embodiment. The semiconductor light emitting device 4 includes a substrate 110, a light emitting body 120a, and a light emitting body 120b. The substrate 110 is conductive. The substrate 110 is a silicon substrate. The light emitting bodies 120a and 120b are provided on the substrate 110. A metal layer 115 is provided on a rear surface of the substrate 110. The light emitting bodies 120a and 120b each contain, for example, a nitride semiconductor. The metal layer 115 contains, for example, titanium (Ti), platinum (Pt) and gold (Au).

The light emitting bodies 120a and 120b each include an n-type semiconductor layer 121, a light emitting layer 123, and a p-type semiconductor layer 125. The light emitting layer 123 is provided between the n-type semiconductor layer 121 and the p-type semiconductor layer 125. The light emitting bodies 120a and 120b each include a light emitting portion 120e and a non-emitting portion 120n. The light emitting portion 120e includes the n-type semiconductor layer 121, the light emitting layer 123 and the p-type semiconductor layer 125. The non-emitting portion 120n is a portion of the n-type semiconductor layer 121, in which parts of the light emitting layer 123 and the p-type semiconductor layer 125 are removed. On a side opposite to the substrate 110, a surface 120s is roughened in each of the light emitting bodies 120a and 120b.

The semiconductor light emitting device 4 further includes a p-side contact layer 127, p-side cap layers 129a and 129b, and n-side electrodes 130a and 130b. Each of the light emitting bodies 120a and 120b includes the p-type semiconductor layer 125 electrically connected the p-side contact layer 127. The p-side contact layer 127 is, for example, a metal layer containing silver (Ag).

The p-side cap layer 129a covers the p-side contact layer 127 electrically connected to the p-type semiconductor layer 125 of the light emitting body 120a. The p-side cap layer 129b covers the p-side contact layer 127 electrically connected to the p-type semiconductor layer 125 of the light emitting body 120b. Each of the p-side cap layers 129a and 129b are, for example, a metal layer containing at least one of aluminum (Al), titanium (Ti), platinum (Pt), and nickel (Ni), and is formed using a vacuum deposition.

The n-side electrode 130a is electrically connected to the n-type semiconductor layer 121 at the non-emitting portion 120n of the light emitting body 120a. The n-side electrode 130b is electrically connected to the n-type semiconductor layer 121 in the non-emitting portion 120n of the light emitting body 120b. Each of the n-side electrodes 130a and 130b are, for example, a metal layer containing aluminum (Al).

The light emitting bodies 120a and 120b are provided on the substrate 110 via a bonding layer 140 and an insulating layer 150. The bonding layer 140 is provided between the substrate 110 and the insulating layer 150. The bonding layer 140 includes, for example, a bonding metal such as a solder material. The insulating layer 150 is, for example, a silicon oxide layer.

The p-side contact layer 127 and the p-side cap layer 129a on one side are provided between the insulating layer 150 and the light emitting body 120a. The p-side contact layer 127 and the p-side cap layer 129b on the other side are provided between the insulating layer 150 and the light emitting body 120b. The n-side electrode 130a is provided between the non-emitting portion 120n of the light emitting body 120a and the insulating layer 150. The n-side electrode 130b is provided between the non-emitting portion 120n of the light emitting body 120b and the insulating layer 150.

Further, the semiconductor light emitting device 4 includes interconnections 131, 133, and 135, and a p-side bonding pad 170. The interconnection 131 electrically connects the light emitting body 120a and the p-side bonding pad 170. The interconnection 133 electrically connects the light emitting body 120a and the light emitting body 120b. The interconnection 135 electrically connects the light emitting body 120b and the substrate 110. The interconnections 131, 133, and 135 are each, for example, a metal layer containing aluminum (Al).

The interconnection 131 is provided in the insulating layer 150 and is electrically insulated from the substrate 110. The interconnection 131 is connected to the p-side cap layer 129a. Further, the interconnection 131 is electrically connected to the p-side bonding pad 170 through a conductive body 137. The conductive body 137 is provided in a contact hole formed in the insulating layer 150.

The interconnection 133 is provided in the insulating layer 150 and is electrically insulated from the substrate 110. The interconnection 133 is connected to the n-side electrode 130a and the p-side cap layer 129b.

The interconnection 135 electrically connects the light emitting body 120b and the substrate 110 through the n-side electrode 130b and the bonding layer 140. The interconnection 135 is provided in the insulating layer 150, and thus, not have a direct electrical connection to the substrate 110. The interconnection 135 is connected to the n-side electrode 130b. Further, the interconnection 135 is electrically connected to the bonding layer 140 through a conductive body 139. The conductive body 139 is provided in a contact hole formed in the insulating layer 150.

In this manner, the semiconductor light emitting device 4 includes the light emitting bodies 120a and 120b connected in series between the p-side bonding pad 170 and the substrate 110. In the semiconductor light emitting device 4, a luminous area in the chip surface can be enlarged by omitting an n-side bonding pad. In this example, the light emitting body 120a is directly connected to the light emitting body 120b, however, three or more light emitting bodies 120 may be connected in series by interposing another light emitting body 120 between the light emitting body 120a and the light emitting body 120b.

Figure 10:
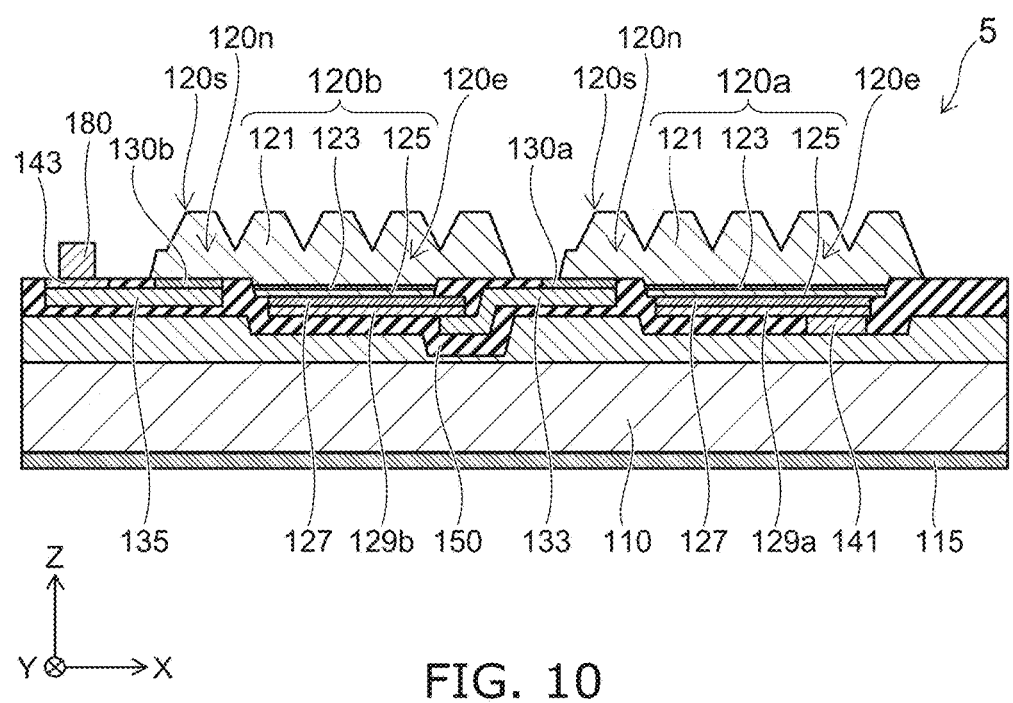
FIG. 10 is a cross-sectional view showing a semiconductor light emitting device according to a variation of the third embodiment.

FIG. 10 is a schematic cross-sectional view showing a semiconductor light emitting device 5 according to a variation of the third embodiment. The semiconductor light emitting device 5 includes a substrate 110, a light emitting body 120a, and a light emitting body 120b. In this example, the light emitting bodies 120a and 120b are connected in series between the substrate 110 and an n-side bonding pad 180.

As shown in FIG. 10, the light emitting body 120a is electrically connected to the substrate 110 through a conductive body 141 and a bonding layer 140. The conductive body 141 is provided in a contact hole formed in an insulating layer 150 and is in contact with a p-side cap layer 129a and the bonding layer 140.

An interconnection 133 is connected to an n-side electrode 130a and a p-side cap layer 129b, and electrically connects the light emitting body 120a and the light emitting body 120b. An interconnection 135 electrically connects the light emitting body 120b and the n-side bonding pad 180. The interconnection 135 is connected to an n-side electrode 130b electrically connected to an n-type semiconductor layer 121 of the light emitting body 120b. Further, the interconnection 135 is electrically connected to the n-side bonding pad 180 through a conductive body 143. The conductive body 143 is provided in a contact hole formed in the insulating layer 150 and is in contact with the interconnection 135 and the n-side bonding pad 180.

In this manner, in the semiconductor light emitting device 5, a luminous area in the chip surface can be enlarged by omitting a p-side bonding pad. Further, three or more light emitting bodies 120 may be connected in series by interposing another light emitting body 120 between the light emitting body 120a and the light emitting body 120b.

Fourth Embodiment

Figure 11:
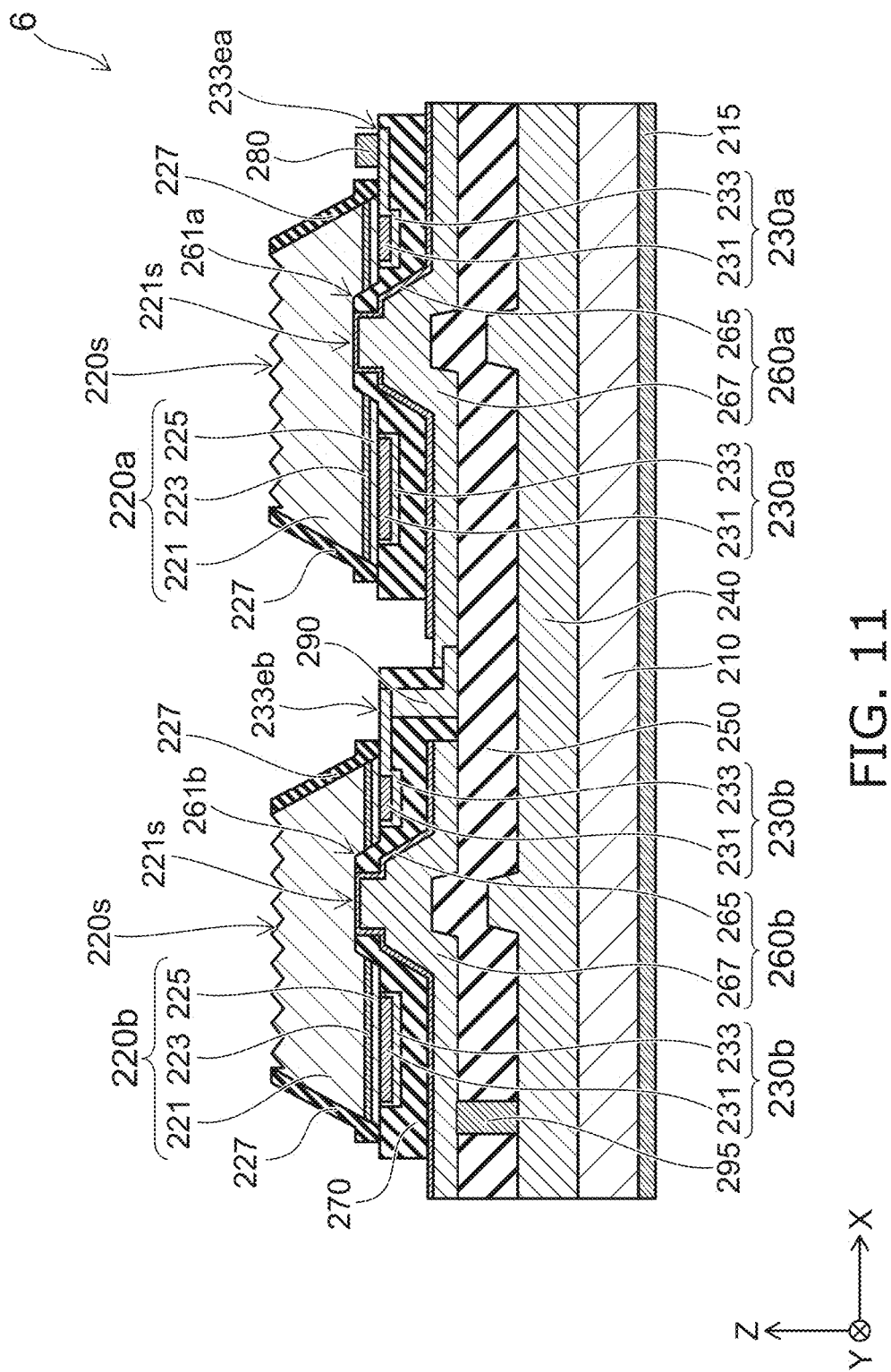
FIG. 11 is a cross-sectional view showing a semiconductor light emitting device according to a fourth embodiment.

FIG. 11 is a schematic cross-sectional view showing a semiconductor light emitting device 6 according to a fourth embodiment. The semiconductor light emitting device 6 includes a light emitting body 220a and a light emitting body 220b. The light emitting bodies 220a and 220b each contain a nitride semiconductor, for example.

The light emitting bodies 220a and 220b each include an n-type semiconductor layer 221, a light emitting layer 223, and a p-type semiconductor layer 225. The light emitting layer 223 is provided between the n-type semiconductor layer 221 and the p-type semiconductor layer 225. The light emitting bodies 220a and 220b are provided, for example, on a substrate 210 via a bonding layer 240 and an insulating layer 250. A surface 220s is roughened in each of the light emitting bodies 220a and 220b on a side thereof opposite to the substrate 210.

The substrate 210 is conductive. A metal layer 215 is provided on a rear surface of the substrate 210. The substrate 210 is, for example, a silicon substrate. The bonding layer 240 is conductive, and contains, for example, a bonding metal such as a solder material. The insulating layer 250 is, for example, a silicon oxide layer. The metal layer 215 contains, for example, titanium (Ti), platinum (Pt), and gold (Au).

The semiconductor light emitting device 6 further includes p-side electrodes 230a and 230b, n-side electrodes 260a and 260b, and an insulating layer 270. The p-side electrode 230a is electrically connected to the p-type semiconductor layer 225 of the light emitting body 220a. The p-side electrode 230b is electrically connected to the p-type semiconductor layer 225 of the light emitting body 220b. The p-side electrodes 230a and 230b each include a p-side contact layer 231 and a p-side cap layer 233. The p-side contact layer 231 is electrically connected to the p-type semiconductor layer 225. The p-side cap layer 233 covers the p-side contact layer 231 on a surface of the p-type semiconductor layer 225.

The insulating layer 270 covers each of the p-side electrodes 230a and 230b. The insulating layer 270 electrically insulates the p-side electrode 230a and the n-side electrode 260a from each other. Further, the insulating layer 270 electrically insulates the p-side electrode 230b and the n-side electrode 260b from each other.

Each of the n-side electrodes 260a and 260b are provided between the insulating layer 250 and the insulating layer 270. The n-side electrode 260a is electrically connected to the n-type semiconductor layer 221 in a recess portion 261a provided in the light emitting body 220a. The n-side electrode 260b is electrically connected to the n-type semiconductor layer 221 in a recess portion 261b provided in the light emitting body 220b. Each of the recess portions 261a and 261b extends through the p-type semiconductor layer 225 and the light emitting layer 223 to have a depth capable of reaching the n-type semiconductor layer 221. The insulating layer 270 extends along an inner wall in each of the recess portions 261a and 261b, and electrically insulates the light emitting layer 223 and the p-type semiconductor layer 225 from the n-side electrodes 260a and 260b in the light emitting bodies 220a and 220b.

The n-side electrodes 260a and 260b each include, for example, an n-side contact layer 265 and an embedding layer 267. The n-side contact layer 265 has, for example, a multilayer structure including an aluminum (Al) layer, a nickel (Ni) layer and a copper (Cu) layer. The aluminum (Al) layer is in contact with the n-type semiconductor layer 221 and is electrically connected thereto. The copper (Cu) layer acts, for example, as a seed layer for Cu plating. The embedding layer 267 is, for example, a Cu plating layer.

The semiconductor light emitting device 6 further includes a p-side bonding pad 280, a interconnection 290 and a conductive body 295. The p-side bonding pad 280 is provided on an extended portion 233ea of the p-side electrode 230a. The extended portion 233ea is a portion of the p-side cap layer 233 extending outside the light emitting body 220a along the insulating layer 270.

The interconnection 290 electrically connects the light emitting body 220a and the light emitting body 220b. The interconnection 290 is provided in the insulating layer 270, and is electrically connected to an extended portion 233eb of the p-side electrode 230b and the n-side electrode 260a. The extended portion 233eb is a portion of the p-side cap layer 233 extending outside the light emitting body 220b along the insulating layer 270. That is, the interconnection 290 electrically connects the p-side electrode 230b and the n-side electrode 260a.

The conductive body 295 is electrically connected to the substrate 210 through the bonding layer 240. Further, the conductive body 295 is electrically connected to the light emitting body 220b through the n-side electrode 260b. The conductive body 295 is formed in a contact hole provided in the insulating layer 250, and is in contact with the bonding layer 240 and the n-side electrode 260b.

In this example, the light emitting body 220a and the light emitting body 220b are connected in series between the p-side bonding pad 280 and the substrate 210. The embodiment is not limited thereto, and three or more light emitting bodies 220 may be connected in series by interposing another light emitting body 220 between the light emitting body 220a and the light emitting body 220b.

In the semiconductor light emitting devices 1 to 6 according to the above-mentioned first to fourth embodiments, the luminous area occupied by the light emitting body may be increased by decreasing the area of the bonding pad disposed on the chip surface. Further, the Joule heat generated in the light emitting body may be efficiently dissipated by using a conductive substrate. For example, heat dissipation is suppressed in the case where the light emitting body 20 is provided on an insulating substrate, such as sapphire or the like, and the light emitting body 20 may have lower light emitting efficiency and poor reliability. Although an insulator such as aluminum nitride may be used for the substrate, which has higher heat conductivity, such a material is expensive.

The "nitride semiconductor" referred to herein includes group III-V compound semiconductors of $B_xIn_yAl_zGa_{1-x-y-z}N$ ($0 \leq x \leq 1$, $0 \leq y \leq 1$, $0 \leq z \leq 1$, $0 \leq x+y+z \leq 1$), and also includes mixed crystals containing a group V element besides N (nitrogen), such as phosphorus (P) and arsenic (As). Furthermore, the "nitride semiconductor" also includes those further containing various elements added to control various material properties such as conductivity type, and those further containing various unintended elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
   a conductive substrate;
   light emitting bodies disposed side by side on the conductive substrate, the light emitting bodies each including a first semiconductor layer of a first conductivity type, a second semiconductor layer of a second conductivity type, and a light emitting layer provided between the first semiconductor layer and the second semiconductor layer, and the light emitting bodies including a first light emitting body electrically connected to the substrate and a second light emitting body electrically connected in series to the first light emitting body;
   a first electrode provided between the first light emitting body and the conductive substrate, and electrically connected to the first semiconductor layer of the first light emitting body and the conductive substrate;
   a second electrode provided between the second light emitting body and the conductive substrate, and electrically connected to the first semiconductor layer of the second light emitting body; and
   a first interconnection electrically connecting the second semiconductor layer of the first light emitting body and the second electrode, the first interconnection including a first portion and a second portion, the first portion extending over the first light emitting body and the second light emitting body, and a second portion extending into the second light emitting body and being electrically connected to the second electrode.

2. The device according to claim 1, further comprising: an insulating layer provided between the second electrode and the conductive substrate.

3. The device according to claim 1, further comprising: an insulating layer having a first portion provided between the first electrode and the conductive substrate, and a second portion between the second electrode and the conductive substrate; and a conductive body extending through the first portion of the insulating layer, and electrically connecting the first electrode and the conductive substrate.

4. The device according to claim 3, wherein the conductive body is metal.

5. The device according to claim 1, wherein
the second light emitting body includes a contact hole communicating with the second electrode; and
the second portion of the first interconnection is provided in the contact hole.

6. The device according to claim 1, further comprising:
a third electrode electrically connected to a third light emitting body, the third light emitting body being included in the light emitting bodies, and connected in series to the second light emitting body, wherein the third electrode is provided between the third light emitting body and the conductive substrate, and is electrically connected to a first semiconductor layer of the third light emitting body; and a second interconnection electrically connecting the second semiconductor layer of the second light emitting body and the third electrode, the second interconnection including a first portion and a second portion, the first portion of the second interconnection extending over the second light emitting body and the third light emitting body, and the second portion of the second interconnection extending through the third light emitting body and being electrically connected to the third electrode.

7. The device according to claim 1, wherein the light emitting bodies further include a fourth light emitting body and a fifth light emitting body, the fourth light emitting body sharing the first electrode with the first light emitting body, and the fifth light emitting body being electrically connected in series to the fourth light emitting body.

8. The device according to claim 1, wherein the first light emitting body and the second light emitting body are arranged on the conductive substrate with a spacing narrower than a distance from each of the first light emitting body and the second light emitting body to an outer periphery of the conductive substrate.

9. The device according to claim 1, wherein the first interconnection has a stacked structure that includes a plurality of metal layers; and the plurality of metal layers include a gold layer that provides an outermost surface thereof.

* * * * *